US010401451B2

United States Patent
Dewdney et al.

(10) Patent No.: US 10,401,451 B2
(45) Date of Patent: Sep. 3, 2019

(54) METHOD, COMPUTER AND MAGNETIC RESONANCE APPARATUS FOR CONTROLLING SHIMMING OF THE BASIC MAGNETIC FIELD

(71) Applicant: Siemens Healthcare GmbH, Erlangen (DE)

(72) Inventors: Andrew Dewdney, Neunkirchen am Brand (DE); Eva Eberlein, Baiersdorf (DE); Andreas Krug, Fuerth (DE)

(73) Assignee: Siemens Healthcare GmbH, Erlangen (DE)

( * ) Notice: Subject to any disclaimer, the term of this patent is extended or adjusted under 35 U.S.C. 154(b) by 178 days.

(21) Appl. No.: 15/347,114

(22) Filed: Nov. 9, 2016

(65) Prior Publication Data

US 2017/0131372 A1    May 11, 2017

(30) Foreign Application Priority Data

Nov. 10, 2015   (DE) .......................... 10 2015 222 114

(51) Int. Cl.
*G01R 33/3875*   (2006.01)
*G01R 33/54*     (2006.01)
*G01R 33/565*    (2006.01)

(52) U.S. Cl.
CPC ....... *G01R 33/3875* (2013.01); *G01R 33/543* (2013.01); *G01R 33/56518* (2013.01); *G01R 33/56563* (2013.01)

(58) Field of Classification Search
CPC .............. G01R 33/3875; G01R 33/543; G01R 33/56518
See application file for complete search history.

(56) References Cited

U.S. PATENT DOCUMENTS

| | | | |
|---|---|---|---|
| 4,950,994 A | 8/1990 | Glover et al. | |
| 5,770,943 A | 6/1998 | Zhou | |
| 6,342,787 B1 | 1/2002 | Petropoulos et al. | |
| 2007/0162190 A1* | 7/2007 | Choubey | G05B 23/0283 700/290 |
| 2009/0102483 A1 | 4/2009 | Zhai et al. | |

(Continued)

OTHER PUBLICATIONS

Bernstein et al., "Section 10.3 Eddy-Current Compensation," Handbook of MRI Pulse Sequences, pp. 316-331 (2004).

*Primary Examiner* — Huy Q Phan
*Assistant Examiner* — Adam S Clarke
(74) *Attorney, Agent, or Firm* — Schiff Hardin LLP

(57) ABSTRACT

In a method for actuating a shim coil arrangement of a magnetic resonance data acquisition scanner that has a shim controller that operates said shim coil arrangement, and a gradient coil arrangement operated by a gradient controller, the gradient controller determine a gradient pulse shape, in accordance with specifications of a magnetic resonance data acquisition sequence, that is activated by the gradient coil arrangement, when the sequence is executed in said scanner. A modifies the gradient pulse shape and provides the modified gradient pulse shape to the shim controller and the shim controller generates shim settings dependent on the modified gradient pulse shape, and actuates said shim coil arrangement according to the shim settings during activation of the gradient pulse shape by the gradient coil arrangement during execution of the sequence in said scanner.

6 Claims, 2 Drawing Sheets

(56) References Cited

U.S. PATENT DOCUMENTS

| | | | |
|---|---|---|---|
| 2010/0148774 A1* | 6/2010 | Kamata | G01R 33/243 324/309 |
| 2010/0286802 A1* | 11/2010 | Feiweier | G01R 33/54 700/90 |
| 2012/0019251 A1* | 1/2012 | Umeda | G01R 33/56518 324/322 |
| 2012/0082357 A1 | 4/2012 | Kidane et al. | |
| 2014/0002077 A1* | 1/2014 | Deshpande | G01R 33/56 324/309 |
| 2014/0159722 A1 | 6/2014 | Fautz | |
| 2014/0333306 A1 | 11/2014 | Ham | |
| 2015/0008921 A1* | 1/2015 | Lee | G01R 33/56518 324/309 |
| 2015/0022203 A1 | 1/2015 | Gumbrecht et al. | |
| 2015/0054510 A1 | 2/2015 | Biber et al. | |

\* cited by examiner

METHOD, COMPUTER AND MAGNETIC RESONANCE APPARATUS FOR CONTROLLING SHIMMING OF THE BASIC MAGNETIC FIELD

BACKGROUND OF THE INVENTION

Field of the Invention

The invention concerns a method for actuating shimming in a magnetic resonance apparatus, as well as a control computer and magnetic resonance apparatus designed to implement such a method.

Description of the Prior Art

In a magnetic resonance (MR) apparatus, also called a magnetic resonance tomography system, a subject to be examined, in particular the body of a patient, is exposed to a relatively strong basic magnetic field with the use of a basic field magnet, for example 1.5 or 3 or 7 tesla. In addition, gradient pulses are activated by a gradient coil arrangement. A radio-frequency antenna also emits high-frequency radio-frequency pulses, for example excitation pulses, from suitable radiators that cause the nuclear spins of specific atoms excited to resonance by these radio-frequency pulses to be tilted by a defined flip angle relative to the magnetic field lines of the basic magnetic field. Upon relaxation of the nuclear spins, radio-frequency signals, known as magnetic resonance signals, are emitted, and are received by suitable radio-frequency antennas and then processed further. Finally, the desired image data can be reconstructed from the raw data acquired in this manner.

Therefore, for a specific scan, a specific magnetic resonance sequence, also referred to as a pulse sequence, is used, which is composed of a series of radio-frequency pulses, for example excitation pulses and refocusing pulses and gradient pulses which are to be emitted and that are suitably coordinated with specific gradient pulse shapes in different gradient axes along different spatial directions. Chronologically coordinated therewith, readout windows are set that predetermine the periods of time in which the induced magnetic resonance signals are acquired (detected).

During magnetic resonance imaging with a magnetic resonance scanner, the homogeneity of the basic magnetic field in the examination volume of the scanner is of great importance. Even small deviations in homogeneity can result in large deviations in the frequency distribution of the nuclear spins, so that lower-quality magnetic resonance image data are acquired. To improve the homogeneity in the examination volume, a magnetic resonance scanner typically has an adjustable shim coil arrangement. Such a shim coil arrangement has electrical shim coils that are fed from an amplifier with different shim currents so as to generate different compensation magnetic fields in order to improve the homogeneity.

The emission of specific gradient pulse shapes, defined by specifications of the magnetic resonance sequence, by the gradient coils of the scanner can result in unwanted eddy current fields in a reception volume of the magnetic resonance sequence. In this context, the operation of the gradient coils can cause eddy currents in all electrically conductive components of the magnetic resonance scanner. Eddy currents are particularly likely to occur in the shielding of the basic field magnet of the scanner that is made, for example, of aluminum. The eddy current fields that occur in the reception volume can result in a loss of quality of the magnetic resonance images acquired by the magnetic resonance sequence. For example, with certain magnetic resonance sequences, fat suppression can be impaired by the eddy current fields.

Although a typical gradient coil arrangement of a magnetic resonance apparatus is designed to ensure the eddy currents caused by the operation of the gradient coils thereof, and hence the eddy current fields in the reception volume of the magnetic resonance sequence, are minimized, production tolerances during the manufacture of the gradient coils can result in a deviation from the desired shape of the actual conductor path of the gradient coil in the conductor guide. For example, primary conductor patterns can be shifted in an axial direction relative to secondary conductor patterns. A shift of this kind can result in a loss of symmetry of the conductor guide in the gradient coil arrangement and hence produce integral terms in the gradient field and eddy current field of the gradient coil arrangement. Thin gradient coil arrangements can be more sensitive to a shift of this kind. While the disruptive terms in the gradient field can typically be ignored, it not usually possible to ignore the integral terms in the eddy current field of the gradient coil arrangement. Typical integral terms in the eddy current field of the gradient coil arrangement are, for example, directed along the z-axis (A (2,0) terms), along the x-axis (A(2,1) terms) or along the y-axis (B(2,1) terms).

SUMMARY OF THE INVENTION

An object of the invention is to enable improved compensation of eddy currents during magnetic resonance imaging.

The method according to the invention for actuating a shim coil arrangement of a magnetic resonance apparatus during magnetic resonance imaging of an object under examination has the following steps.

A gradient pulse shape is provided to a computer, in accordance with the specifications of a magnetic resonance sequence to be used for magnetic resonance imaging of the object under examination. The computer modifies the gradient pulse shape and generates shim settings using the modified gradient pulse shape. A shim coil arrangement is activated using the shim settings, with the actuation of the shim coil arrangement occurring during activation of the gradient pulse shape by the gradient coil arrangement of the magnetic resonance apparatus.

The object under examination can be a patient, a healthy training volunteer, an animal, or a phantom.

The shim coil arrangement is typically integrated in the gradient coil arrangement of the magnetic resonance scanner. Parts of the shim coil arrangement or the entire shim coil arrangement can also be arranged in local coils of the magnetic resonance apparatus. The shim coil arrangement can have a number of shim channels or shim coils. During the magnetic resonance sequence, the shim channels or shim coils of the shim coil arrangement can be fed by a constant or changing shim current. The shim coil arrangement is typically actuated by a shim controller that can be formed by a shim current amplifier. The shim controller can actuate the shim coil arrangement by the use of shim settings. For example, the shim settings can define a, current distribution of the shim currents in shim coils of the shim coil arrangement. The current distribution may be time-dependent. The shim controller can then apply the currents defined by the shim setting to the shim channels or shim coils of the shim coil arrangement during the magnetic resonance imaging.

The gradient pulse shape determines the temporal profile of the gradient amplitude with which the gradient coil arrangement is actuated in accordance with the specifications of the magnetic resonance sequence. In this context, the gradient pulse shape is assigned to an individual gradient circuit or to an individual gradient pulse, or to a number gradient circuits or gradient pulses. The gradient pulse shape can be defined by different parameters, such as a temporal length, a maximum amplitude or a side slope. The gradient pulse shape is provided or generated by a controller of the magnetic resonance apparatus, in particular a gradient controller.

The modification of the gradient pulse shape can take place in the gradient controller or in a processor separate from the gradient controller. The modification of the gradient pulse shape is performed by electronic components or digital filters. The modification of the gradient pulse shape can be implemented by a digital and/or electronically implemented modification algorithm that uses the gradient pulse shape as an input parameter and produces the modified gradient pulse shape as an output parameter.

The generation of the shim settings using the modified gradient pulse shape can be the direct actuation of the shim coil arrangement or a shim amplifier with the modified gradient pulse shape. Alternatively or additionally, the modified gradient pulse shape can be converted into the shim settings by a digitally or electronically implemented transfer function determined, for example, in a calibration measurement.

The shim coil arrangement is actuated during the activation of the gradient pulse shape using the shim settings such that, at least during a part of the period or during the complete period of the activation of the gradient pulse shape, the current distribution of the shim currents defined in accordance with the shim settings flows in the shim coils of the shim coil arrangement. Hence, the shim coil arrangement can be actuated such that the eddy currents generated by the activation of the gradient pulse shape is at least partially or completely compensated by the shim currents defined by the shim settings. In this way, the actuation of the shim coil arrangement and the activation of the gradient pulse shape can be chronologically matched to one another, in particular with the same time delay.

In this context, the synchronization of the actuation of the shim coil arrangement and the activation of the gradient pulse shape can be of particular importance. In this context, the synchronization can be ensured by the generation of the shim settings being triggered by the provision and modification of the gradient pulse shape to be activated. Therefore, the shim settings are not generated independently of the gradient pulse shape to be activated, but can be derived directly from the pulse shape to be activated. Therefore, there is a direct electronically and/or digitally implemented path, which generates shim settings out of a gradient pulse shape prepared for activation, by a modification of the gradient pulse shape with which the shim coil arrangement can be actuated during the activation of the gradient pulse shape. This enables eddy currents generated by the activation of the gradient pulse shape to be automatically compensated by the shim coil arrangement. The magnetic resonance sequence used for the magnetic resonance imaging thus can remain unchanged; i.e. no adaptation of the magnetic resonance sequence is necessary.

The inventive procedure thus can result in an efficient suppression of eddy currents caused by gradient circuits. This enables the quality of the magnetic resonance image data acquired in the magnetic resonance imaging to be increased or artifacts in the magnetic resonance image data to be avoided. This also enables gradient coils found to have a higher deviation from a desired shape in the in-process inspection and testing still to be delivered to the customers instead of being destroyed.

In an embodiment, the modification of the gradient pulse shape involves a formation of the time derivative of the gradient pulse shape, and the generation of the shim settings takes place using the time derivative of the gradient pulse shape. The formation of the time derivative of the gradient pulse shape can be a differentiation of the gradient pulse shape or a calculation of changes to the gradient pulse shape over time. Constant parts of the gradient pulse shape, for example plateaus with a constant amplitude, are thereby suppressed during the formation of the time derivative. It is precisely the rising or falling edges of the gradient pulse shape that come to the fore during the formation of the time derivative. The formation of the time derivative of the gradient pulse shape can take place in a gradient controller designed for this purpose, which relays the accentuation (pre-emphasis) and deaccentuation (de-emphasis) of the gradient pulse shape for the generation of the shim settings and suppresses DC components of the gradient pulse during the relaying. Hence, during the provision of a gradient pulse shape for a linear gradient channel of the gradient coil arrangement, the inventive procedure can include actuation of the shim coil arrangement using shim settings based on the time derivative of the gradient pulse shape. The procedure according to this embodiment is based on the consideration that typically eddy current fields are generated during the rising or falling edges of the gradient pulse shape. Thus, the formation of the time derivative of the gradient pulse shape enables shim settings to be generated, which are suitable for the compensation of the eddy current fields generated by the activation of the gradient pulse shape.

In another embodiment, the modification of the gradient pulse shape and the generation of the shim settings using the modified gradient pulse shape are implemented such that second-order eddy current contributions that occur during the activation of the gradient pulse shape by the gradient coil arrangement are at least partially compensated by the shim settings used for the actuation of the shim coil arrangement. In this embodiment, the modification of the gradient pulse shape can involve the formation of the time derivative of the gradient pulse shape. The inventive procedure can be used to suppress the second-order eddy current contributions. In this way, it is precisely in marginal regions of the reception volume that a significant improvement of the image quality can be achieved, since the second-order eddy current fields typically influence the magnetic resonance image data proportionally to the square of the radius at high radial positions in the reception volume. Hence, the suggested compensation enables a large reception volume to be used for the acquisition of the magnetic resonance image data without any loss of image quality. This can, for example, be in the case of shoulder imaging. It is possible for not only typical integral terms to be compensated in the second-order eddy current field, such as field terms along the z-axis (A(2,0) terms), along the x-axis (A(2,1) terms) or along the y-axis (B(2,1) terms), but also additional cross terms, such as B(2,2) terms.

In another embodiment, the shim coil arrangement is exclusively actuated using the shim settings while rising and/or falling edges of the gradient pulse shape are activated by the gradient coil arrangement. Hence, the shim settings generated using the modified gradient pulse shape are generated to cause shim currents defined by the shim settings only flow through the shim coils only during the activation of the rising and/or falling edges. This inventive actuation of the shim coil arrangement can advantageously be used for the compensation of eddy current fields, which occur during the activation of the rising or falling edges of the gradient pulse shape. Obviously, it is also possible for further shim settings, which are not based on the gradient pulse shape, to be provided that trigger the flow of shim currents during the constant phases of the gradient pulse shape.

In another embodiment, prior to the magnetic resonance imaging of the object under examination, a transfer function, characterizing eddy current contributions of the second-order gradient coil is determined in a calibration procedure, and the generation of the shim settings takes place using the transfer function. In this context, the calibration procedure can measure not only the zero-order and first-order eddy current fields, also called eddy current contributions, but also the second-order eddy current fields. In this context, the calibration can be performed upon the installation of a magnetic resonance apparatus specifically for this magnetic resonance apparatus or specifically for a series of magnetic resonance apparatuses. In this context, the determination of the transfer function can be the determination of amplitudes and time constants for all combinations of second-order terms of the eddy current contributions.

The control computer according to the invention for a magnetic resonance apparatus comprises a gradient controller, a shim controller and an interface between the gradient controller and the shim controller. The interface is designed to receive a gradient pulse shape from the gradient controller, to modify the gradient pulse shape and to transfer the modified gradient pulse shape to the shim controller. The interface can be an electronic connection or an interface between the gradient controller and the shim controller. Hence, the interface can be an input component, which receives the gradient pulse shape from the gradient controller. The interface can be a modification component, which modifies the gradient pulse shape. The interface also may be an output component, which transmits the modified gradient pulse shape to the shim controller. Hence, the interface can enable automatic actuation of the shim coil arrangement, which is triggered by the provision of a gradient pulse shape by the gradient controller. Hence, the control computer according to the invention can enable the above-described automatic compensation of the eddy current fields generated by the activation of the gradient pulse shape. It is also possible for the inventive shim coil arrangement simultaneously to be used for dynamic shimming, as is known to those skilled in the art with which inhomogeneities, in particular second-order inhomogeneities, can be compensated on a slice-by-slice basis, or respiratory influences or other dynamic disturbances can be compensated in real time. The shim setting time for static shim settings can also be reduced for time-critical procedures.

In another embodiment of the control computer the interface is designed to form the time derivative of the received gradient pulse shape and to transfer the time derivative of the gradient pulse shape to the shim controller. To this end, the interface can have suitable components, such as, for example high-pass filters and/or digital filters. Hence, the interface can suppress the DC components of the gradient pulse shape and forward the rising and/or falling edges of the gradient pulse shape to the shim controller. Hence, it is possible for compensation of the eddy currents, which are caused during the activation of the rising and falling edges of gradient pulse shape, to take place.

In another embodiment, of the control computer the interface has control components that enable the transfer of the modified gradient pulse shape to the shim controller in real time during the actuation of the gradient coil arrangement by the gradient controller. Hence, the shim controller can be actuated with the modified gradient pulse shape at the same speed as the gradient coil arrangement is actuated with the gradient pulse shape by the gradient controller. Hence, the shim controller or the shim coil arrangement can perform a particularly advantageous compensation of the eddy currents that occur during the operation of the gradient coil arrangement.

The magnetic resonance apparatus according to the invention has a gradient coil arrangement, a shim coil arrangement and a control computer according to the invention, wherein the gradient controller is designed to actuate the gradient coil arrangement by the gradient pulse shape, and the shim controller is designed to generate shim settings using the modified gradient pulse shape and to actuate the shim coil arrangement with the shim settings. Hence, during operation, the magnetic resonance apparatus exhibits reduced eddy currents in conductive components of the magnetic resonance apparatus.

In another embodiment of the magnetic resonance apparatus, the gradient controller and the shim controller are matched to one another such that the actuation of the shim coil arrangement takes place during the actuation of the gradient coil arrangement by the gradient pulse shape. The synchronization of the shim controller and the gradient controller enables the compensation of the eddy currents caused by the operation of the gradient coil arrangement by the shim coil arrangement.

In another embodiment of the magnetic resonance apparatus the shim coil arrangement has second-order shim coils, the second-order shim coils being actuated using the shim settings. In this context, the second-order shim coils are used to compensate second-order eddy current fields.

In another embodiment of the magnetic resonance apparatus, the shim coil arrangement has shim coils of an order higher than second-order, and the shim coils with the order higher than second-order are actuated using the shim settings. Exactly as described above, it is also possible to determine the transfer function for the higher orders, for example a third or fourth order. The higher-order shim coils can then be provided to compensate higher-order eddy current fields generated by the activation of the gradient pulse shape. In this context, the higher-order shim coils can be integrated in local coils placed directly on the body of the object under examination. The compensation of the higher-order eddy current fields can be particularly advantageous when an asymmetrical gradient coil arrangement is used to activate the gradient pulse shape.

The magnetic resonance apparatus is designed to carry out a method according to the invention. Thus, the magnetic resonance apparatus is designed to carry out the method for the actuation of a shim coil arrangement of a magnetic resonance apparatus during the magnetic resonance imaging of an object under examination. The gradient controller of the control computer of the magnetic resonance apparatus is designed for the provision of a gradient pulse shape in accordance with the specifications of a magnetic resonance sequence used for magnetic resonance imaging of the object under examination. The interface is designed for the modification of the gradient pulse shape. The shim controller is designed to generate shim settings using the modified gradient pulse shape. The shim controller is designed to actuate the shim coil arrangement using the shim settings, wherein the actuation of the shim coil arrangement takes place during an activation of the gradient pulse shape by the gradient coil arrangement of the magnetic resonance apparatus.

The advantages of the control computer according to the invention and the magnetic resonance apparatus according to the invention substantially correspond to the advantages of the method according to the invention as described in detail above. All features, advantages or alternative embodiments can also be transferred to the other aspects of the invention. The corresponding functional features of the method are implemented by corresponding objective modules, in particular by hardware modules.

DESCRIPTION OF THE PREFERRED EMBODIMENTS

Figure 1:
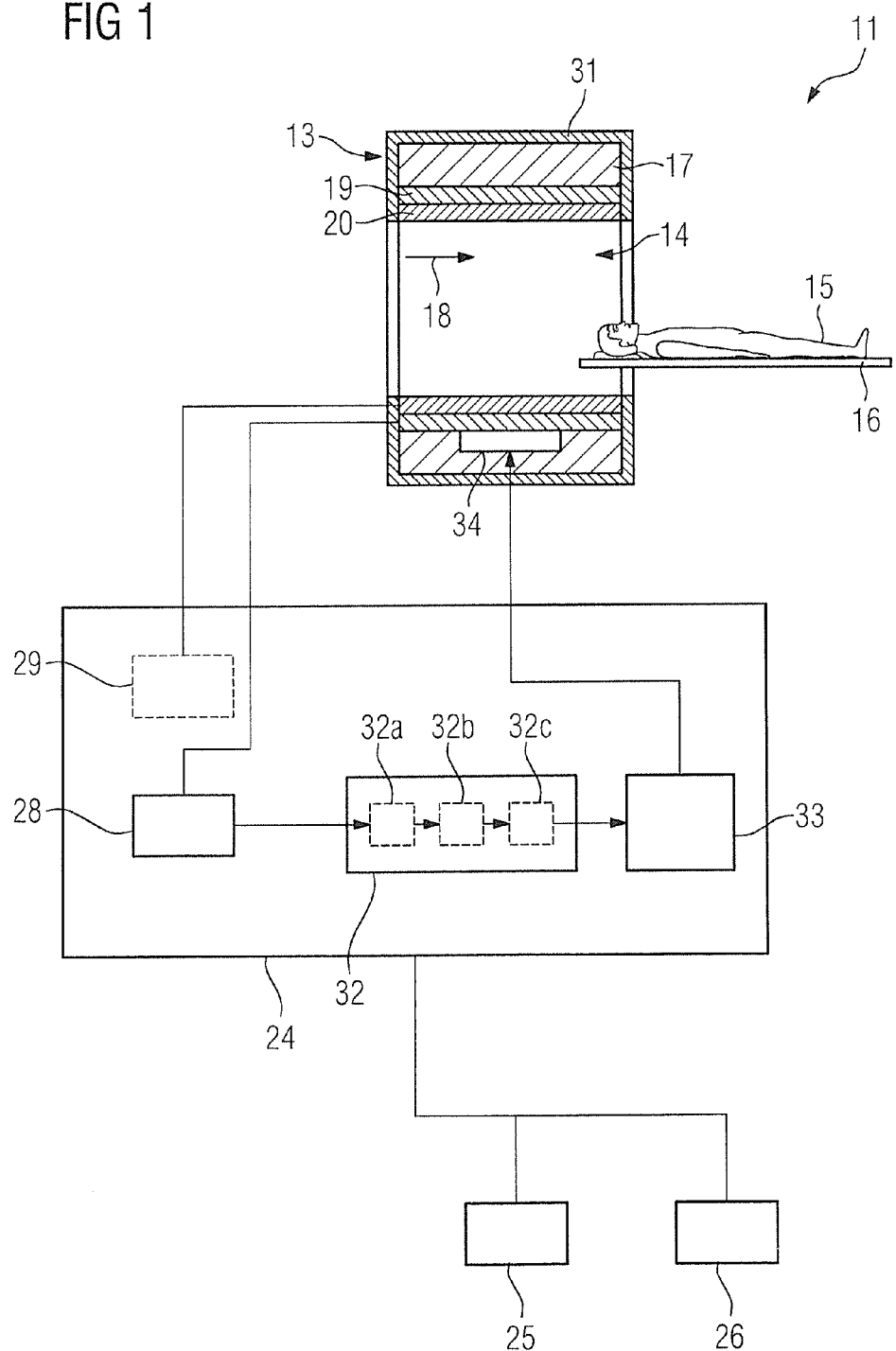
FIG. 1 schematically illustrates a magnetic resonance apparatus according to the invention, with a control computer according to the invention.

FIG. 1 is a schematic view of a magnetic resonance apparatus according to the invention with a control computer according to the invention.

The magnetic resonance apparatus 11 has a scanner 13 with a basic field magnet 17 for generating a strong and constant basic magnetic field 18. In addition, the scanner 13 has a cylindrical patient-receiving region 14 for receiving an object under examination 15, in the present case a patient, wherein the patient-receiving region 14 is cylindrically surrounded by the scanner 13 in a circumferential direction. The patient 15 can be moved into the patient-receiving region 14 by a patient support 16 of the magnetic resonance apparatus 11. To this end, the patient support 16 has an examination table that is moveable within the scanner 13. The scanner 13 is shielded from the outside by a housing shell 31.

The scanner 13 also has a gradient coil arrangement 19 for generating magnetic field gradients that are used for spatial encoding during imaging. The scanner 13 also has a radio-frequency antenna 20, which in the case illustrated is a body coil permanently integrated in the scanner 13, and a radio-frequency antenna controller 29 that operates the radio-frequency antenna 20 to emit radio-frequency magnetic resonance sequences into an examination chamber that is substantially formed by the patient-receiving region 14. The emitted radio-frequency sequences cause the nuclear spins of certain atoms to be deflected from an equilibrium position imposed by the basic magnetic field 18. As these excited nuclear spins relax, they emit radio-frequency signals called magnetic resonance signals. The radio-frequency antenna 20, or a local coil thereof (not shown) is designed to receive the magnet resonance signals from the patient 15.

The magnetic resonance apparatus 11 also has a shim coil arrangement 34. The shim coil arrangement 34 shown in FIG. 1 is situated in the immediate spatial proximity of the gradient coil arrangement 19 or integrated in the gradient coil arrangement 19. However, it is also conceivable for parts of the shim coil arrangement 34 or the entire shim coil arrangement 34 to be arranged in local coils (not shown) of the magnetic resonance apparatus 11. The shim coil arrangement can have a number of shim channels or shim coils. The shim coil arrangement 34 in particular has second-order shim coils, wherein the second-order shim coils are actuated using shim settings. The shim coil arrangement 34 can also have shim coils of an order higher than second-order, wherein the shim coils of the order higher than second-order are actuated using the shim settings.

The control computer 24 comprises a gradient controller 28 and a shim controller 33. The gradient controller 28 is designed (programmed) to actuate the gradient coil arrangement 19 by means of a gradient pulse shape. The shim controller 33 is designed to generate shim settings and to actuate the shim coil arrangement 34 with the shim settings. In the case illustrated, the control computer 24 depicted also has a radio-frequency antenna controller 29 designed to operate the radio-frequency antenna 20.

The control computer 24 also has an interface 32 from the gradient controller 28 to the shim controller 33. The interface has an input component 32a, which receives a gradient pulse shape from the gradient controller 28. The interface also has a modification component 32b, which modifies the gradient pulse shape. The interface also has an output component 32c, which transmits the modified gradient pulse shape to the shim controller 33. The shim controller 33 can then generate the shim settings using the modified gradient pulse shape.

The interface 32, in particular the modification component 32b and the output component 32c thereof, can be designed to form the time derivative of the received gradient pulse shape and to transfer the time derivative of the gradient pulse shape to the shim controller 33. The output component 32c can enable the transfer of the modified gradient pulse shape to the shim controller 32c in real time during the actuation of the gradient coil arrangement 19 by means of the gradient controller 28. The gradient controller 28 and the shim controller 33 are matched to one another such that the actuation of the shim coil arrangement 34 takes place during the actuation of the gradient coil arrangement 19 by the gradient pulse shape.

Reconstructed magnetic resonance images can be shown to a user on an output interface 25, in the present case a display monitor, of the magnetic resonance apparatus 11. The magnetic resonance apparatus 11 also comprises an input interface 26 via which information and/or parameters can be entered by a user during a scanning procedure.

The magnetic resonance apparatus 11 is hence configured together with the control computer 24 to carry out the method according to the invention to actuate the shim coil arrangement 34 during magnetic resonance imaging of the object under examination 15.

The magnetic resonance apparatus 11 can obviously have further components that are usually present in magnetic resonance apparatuses. The general mode of operation of a magnetic resonance apparatus is known to those skilled in the art, so a more detailed description of its operation is not necessary herein.

Figure 2:
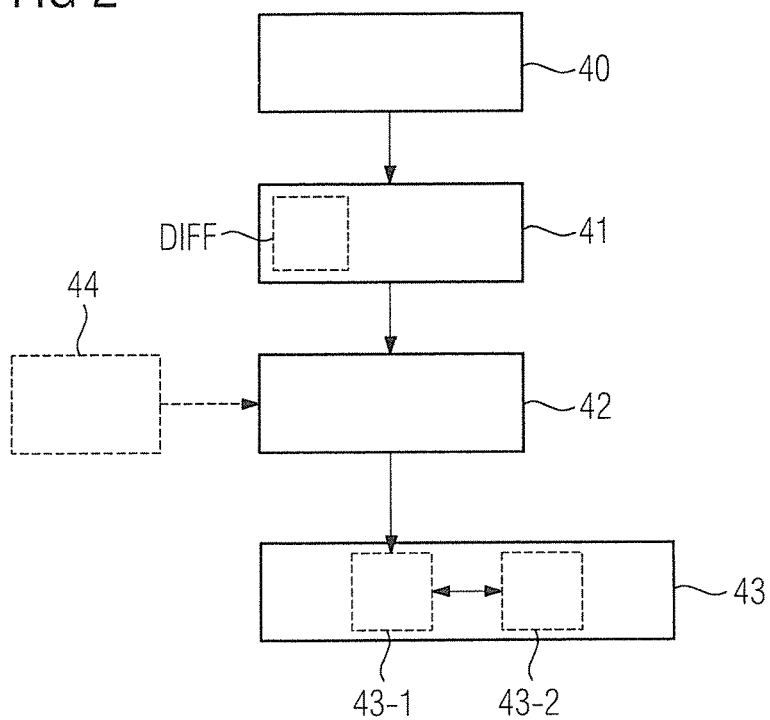
FIG. 2 is a flowchart of an embodiment of the method according to the invention.

FIG. 2 is a flowchart of a first embodiment of the method according to the invention to actuate the shim coil arrangement 34 of the magnetic resonance apparatus 11 during magnetic resonance imaging of the object under examination 15.

In a first method step 40, a gradient pulse shape is provided by the gradient controller 28 of the control computer 24 in accordance with the specifications of a magnetic resonance sequence, which is used for magnetic resonance imaging of the object under examination 15. The gradient pulse shape is subsequently transferred from the gradient controller 28 to the interface 32 of the control computer 24.

In a further method step 41, the gradient pulse shape is modified by means of the interface 32 of the control computer 24. The modification of the gradient pulse shape can be a formation of the time derivative of the gradient pulse shape in a sub-step DIFF of the further method step 41. The time derivative of the gradient pulse shape can then be transferred from the interface 32 to the shim controller 33.

In a further method step 42, shim settings are generated using the modified gradient pulse shape by the shim controller 33 of the control computer 24. In this context, the generation of the shim settings takes place using the time derivative of the gradient pulse shape, which was generated in the sub-step DIFF of the further method step 41.

In a further method step 43, the shim coil arrangement 34 is actuated using the shim settings by the shim controller 33 in a first sub-step 43-1 of the further method step 43. Simultaneously, the gradient pulse shape is activated by means of the gradient coil arrangement 19 of the magnetic resonance apparatus 11 in a second sub-step 43-2 of the further method step 43. In this context, the original gradient pulse shape, not the modified gradient pulse shape, is activated, by means of the gradient coil arrangement 19. In this context, the actuation of the shim coil arrangement 34 takes place during the activation of the gradient pulse shape by the gradient coil arrangement 19. The shim coil arrangement 34 is exclusively actuated using the shim settings while the rising and/or falling edges of the gradient pulse shape are activated by the gradient coil arrangement 19.

In the method as shown in FIG. 2, the modification of the gradient pulse shape and the generation of the shim settings using the modified gradient pulse shape take place such that second-order eddy current contributions, which occur during the activation of the gradient pulse shape by means of the gradient coil arrangement 19, are at least partially compensated by the shim settings, which are used for the actuation of the shim coil arrangement 33.

Prior to the magnetic resonance imaging of the object under examination 15, it is possible to determine, in a calibration in a further method step 44, a transfer function characterizing eddy current contributions of second-order coils of the gradient coil arrangement 19, wherein the generation of the shim settings takes place using the transfer function.

Figure 3:
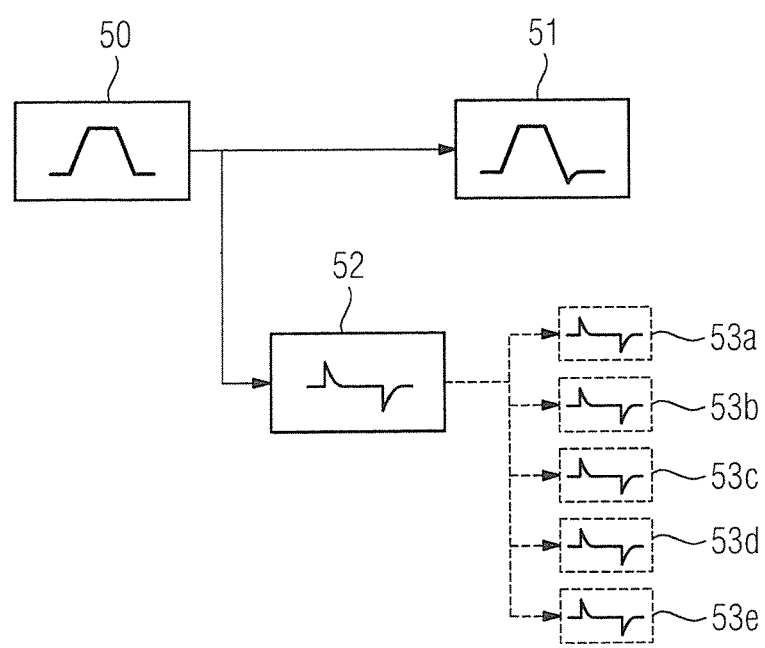
FIG. 3 is an exemplary illustration of the procedure according to the invention.

FIG. 3 is an exemplary illustration of the procedure according to the invention. Obviously, the shapes depicted in FIG. 3 should be considered to be exemplary only. The gradient pulse shape shown and the modifications thereof can obviously also be embodied differently to the depiction in FIG. 3.

Block 50 depicts an exemplary gradient pulse shape provided by the gradient controller 28. The gradient pulse shape has a plateau with constant amplitude, a rising edge and a falling edge.

The gradient pulse shape is now transferred to the gradient coil arrangement 19, by which, as shown in Block 51, it is activated for the magnetic resonance imaging, as shown in Block 51.

The gradient pulse shape is transferred not only to the gradient coil arrangement 19, but also to the interface 32. The interface modifies the gradient pulse shape in a further step. In this context, a particularly advantageous modification of the gradient pulse shape is the formation of the time derivative of the gradient pulse shape. Block 52 depicts the time derivative of the gradient pulse shape shown in Block 50. The plateau with constant amplitude is depicted in the time derivative of the gradient pulse shape as a zero line. The rising and falling edges of the gradient pulse shape are clearly evident as depicted in Block 52.

The modified gradient pulse shape, i.e. the time derivative of the gradient pulse shape, is now transferred from the interface 32 to the shim controller 33. The shim controller 33 can use the time derivative of the gradient pulse to generate shape shim settings by which the shim coil arrangement 34 is actuated by the shim controller 33.

Blocks 53*a*, 53*b*, 53*c*, 53*d*, 53*e* depict exemplary current distributions for five second-order shim coils of the shim coil arrangement 34. In this context, the current distributions shown are based on the time derivative of the gradient pulse shape shown in Block 52. In the case shown, the current distributions are embodied the same for all five shim coils although this does not have to be the case in a specific application.

The gradient pulse shape 51 can now be activated by the gradient coil arrangement 19, while the shim coils of the shim coil arrangement 34 are simultaneously fed by the current distributions shown in Blocks 53*a*, 53*b*, 53*c*, 53*d*, 53*e*. It is evident that current only flows through the shim coils when the rising and the falling edges of the gradient pulse shape are activated by the gradient coil arrangement 19. Hence, this enables particularly advantageous compensation of the eddy current fields, which are generated by the activation of the rising and the falling edges of the gradient pulse shape by the current distributions shown in Blocks 53*a*, 53*b*, 53*c*, 53*d*, 53*e* in the second-order shim coils.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for actuating a shim coil arrangement of a magnetic resonance data acquisition scanner during operation of the scanner to acquire magnetic resonance data from an object in the scanner, said scanner comprising a shim controller that operates said shim coil arrangement, and a gradient coil arrangement operated by a gradient controller, said method comprising:

providing said gradient controller with a gradient pulse shape in accordance with specifications of a magnetic resonance data acquisition sequence designated for use in acquiring said magnetic resonance data from the object;

operating said scanner in a calibration procedure in in which said gradient controller applies a gradient pulse, having said gradient pulse shape, to said gradient coil arrangement so as to produce a gradient field in said scanner;

determining a transfer function in a processor that characterizes eddy current contributions of a second order, made by said gradient field produced by said gradient coil arrangement, to eddy currents produced in said scanner by said operation of the gradient coil arrangement;

in said processor, modifying said gradient pulse shape so as to produce a modified gradient pulse shape, and providing the modified gradient pulse shape and said transfer function to said shim controller and, in said shim controller, generating shim settings dependent on the modified gradient pulse shape and said transfer function so that said second-order eddy current contributions are at least partially compensated by said shim settings; and actuating said shim coil arrangement from said shim controller according to said shim settings during activation of said gradient pulse shape by said gradient coil arrangement during execution of said sequence in said scanner.

2. A method as claimed in claim 1 comprising modifying said gradient pulse shape by forming the time derivative of said gradient pulse shape, and generating said shim setting dependent on said time derivative of the gradient pulse shape.

3. A method as claimed in claim 1 comprising actuating said shim coil arrangement with said shim settings exclusively during at least one of a rising edge and a falling edge of said gradient pulse shape activated by said gradient coil arrangement.

4. A magnetic resonance apparatus comprising:
a magnetic resonance data acquisition scanner;
a control computer configured to operate said scanner so as to acquire magnetic resonance data from an object in said scanner;
a shim coil arrangement in said magnetic resonance data acquisition scanner, and a shim controller that operates said shim coil arrangement;
a gradient coil arrangement, in said magnetic resonance data acquisition scanner and a gradient controller that operates said gradient coil arrangement;
said gradient controller being provided with a gradient pulse shape in accordance with specifications of a magnetic resonance data acquisition sequence designated for use in acquiring said magnetic resonance data from the object;
said control computer being configured to operate said scanner in a calibration procedure operating said scanner in which said gradient controller applies a gradient pulse, having said gradient pulse shape, to said gradient coil arrangement so as to produce a gradient field in said scanner;
said control computer being configured to determine a transfer function that characterizes eddy current contributions of a second order, made by said gradient field produced by said gradient coil arrangement, to eddy currents produced in said scanner by said operation of said gradient coil arrangement;
said control computer being configured to modify said gradient pulse shape;
said shim controller being provided with the modified gradient pulse shape, and said shim controller being configured to generate shim setting dependent on the modified gradient pulse shape and said transfer function, so that said second-order eddy current contributions are at least partially compensated by said shim settings; and
said shim coil controller being configured to actuate said shim coil arrangement according to said shim settings during actuation of said gradient pulse shape by said gradient coil arrangement during execution of said sequence in said scanner.

5. A magnetic resonance apparatus as claimed in claim 4 wherein said shim coil arrangement comprises second-order shim coils, and comprising actuating said second-order shim coils using said shim settings.

6. A magnetic resonance apparatus as claimed in claim 4 wherein said shim coil arrangement comprises shim coils of an order higher than second-order, and wherein said shim coils with said order higher than second-order are actuated using said shim settings.

* * * * *